United States Patent
Steck, Jr.

(10) Patent No.: US 7,423,442 B2
(45) Date of Patent: Sep. 9, 2008

(54) SYSTEM AND METHOD FOR EARLY QUALIFICATION OF SEMICONDUCTOR DEVICES

(75) Inventor: John W. Steck, Jr., Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 69 days.

(21) Appl. No.: 11/187,486

(22) Filed: Jul. 22, 2005

(65) Prior Publication Data

US 2007/0018671 A1 Jan. 25, 2007

(51) Int. Cl.
G01R 31/26 (2006.01)

(52) U.S. Cl. .................. 324/765; 324/73.1; 702/42; 702/81; 700/110

(58) Field of Classification Search .......... 324/763, 324/73, 765, 158.1, 73.1; 716/4; 702/117–118, 702/183, 81–84, 42, 35–36, 58–59, 185; 700/108–110
See application file for complete search history.

(56) References Cited

U.S. PATENT DOCUMENTS

| | | | |
|---|---|---|---|
| 4,751,656 A * | 6/1988 | Conti et al. ................ 716/1 |
| 6,258,609 B1 * | 7/2001 | Farnworth et al. ............ 438/14 |
| 6,473,665 B2 * | 10/2002 | Mugibayashi et al. ....... 700/110 |
| 6,499,118 B1 * | 12/2002 | Michaelson ................ 714/711 |
| 6,697,691 B1 * | 2/2004 | Miller et al. ................ 700/108 |
| 6,885,961 B2 * | 4/2005 | Breger et al. ............... 702/117 |

* cited by examiner

Primary Examiner—Ernest F. Karlsen
Assistant Examiner—Arleen M Vazquez
(74) Attorney, Agent, or Firm—Jacqueline J. Garner; W. James Brady, III; Frederick J. Telecky, Jr.

(57) ABSTRACT

According to one embodiment of the invention, a method for early qualification of semiconductor device includes performing initial testing on a semiconductor device, receiving fail data on the semiconductor device, determining a solution model for the semiconductor device based on the fail data, storing the solution model, performing subsequent testing on the semiconductor device, and comparing a result of the subsequent testing to the solution model.

18 Claims, 2 Drawing Sheets

SYSTEM AND METHOD FOR EARLY QUALIFICATION OF SEMICONDUCTOR DEVICES

TECHNICAL FIELD OF THE INVENTION

This invention relates generally to the field of semiconductor device testing and, more specifically, to a system and method for early qualification of semiconductor devices.

BACKGROUND OF THE INVENTION

Early qualification testing is important in assessing new immature fabrication processes for semiconductor devices. Early semiconductor die fabricated with such immature fabrication processes may be rife with defects, which results in few if any nominal or repairable die for early failure rate studies. This may be further complicated when chip repair and electrical die identification is not yet available.

SUMMARY OF THE INVENTION

According to one embodiment of the invention, a method for early qualification of semiconductor device includes performing initial testing on a semiconductor device, receiving fail data on the semiconductor device, determining a solution model for the semiconductor device based on the fail data, storing the solution model, performing subsequent testing on the semiconductor device, and comparing a result of the subsequent testing to the solution model.

Some embodiments of the invention provide numerous technical advantages. Other embodiments may realize some, none, or all of these advantages. For example, in one embodiment, a virtual repair solution allows the use of partially-working devices for early qualification of semiconductor devices. Early learning on new immature fabrication processes may be realized. Embodiments of the invention may allow repair and/or trim operations to be delayed to later test operations. Furthermore, only a minimal amount of samples for evaluation may be required for early qualification.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION

Figure 1:
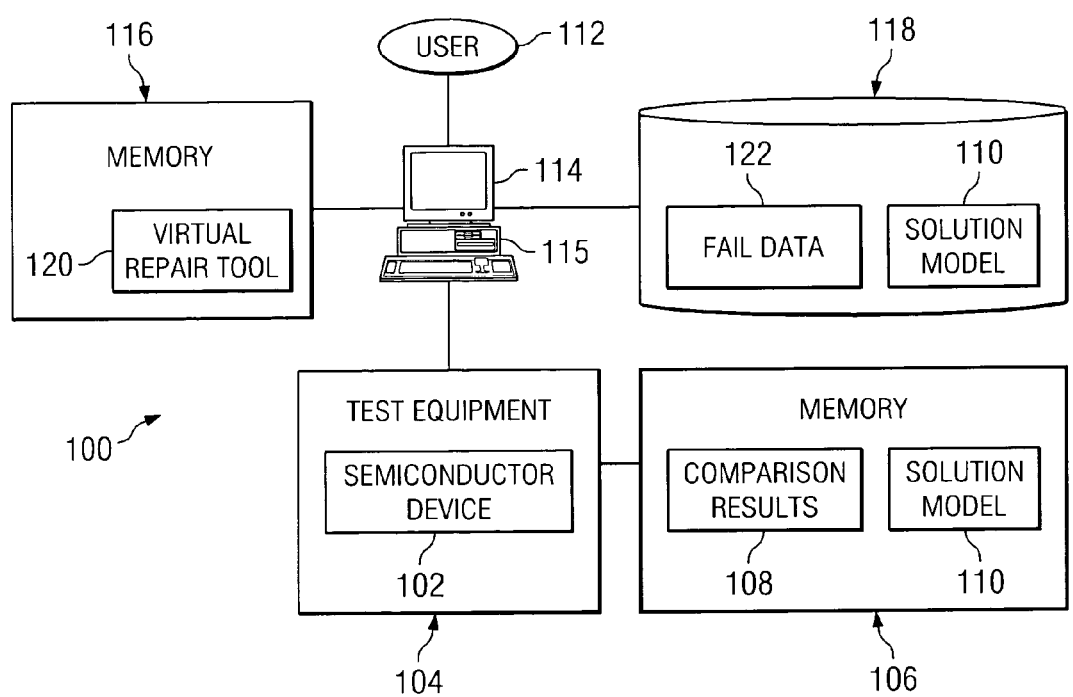
FIG. 1 is a block diagram illustrating a system for early qualification of semiconductor devices according to one embodiment of the present invention.
Figure 2:
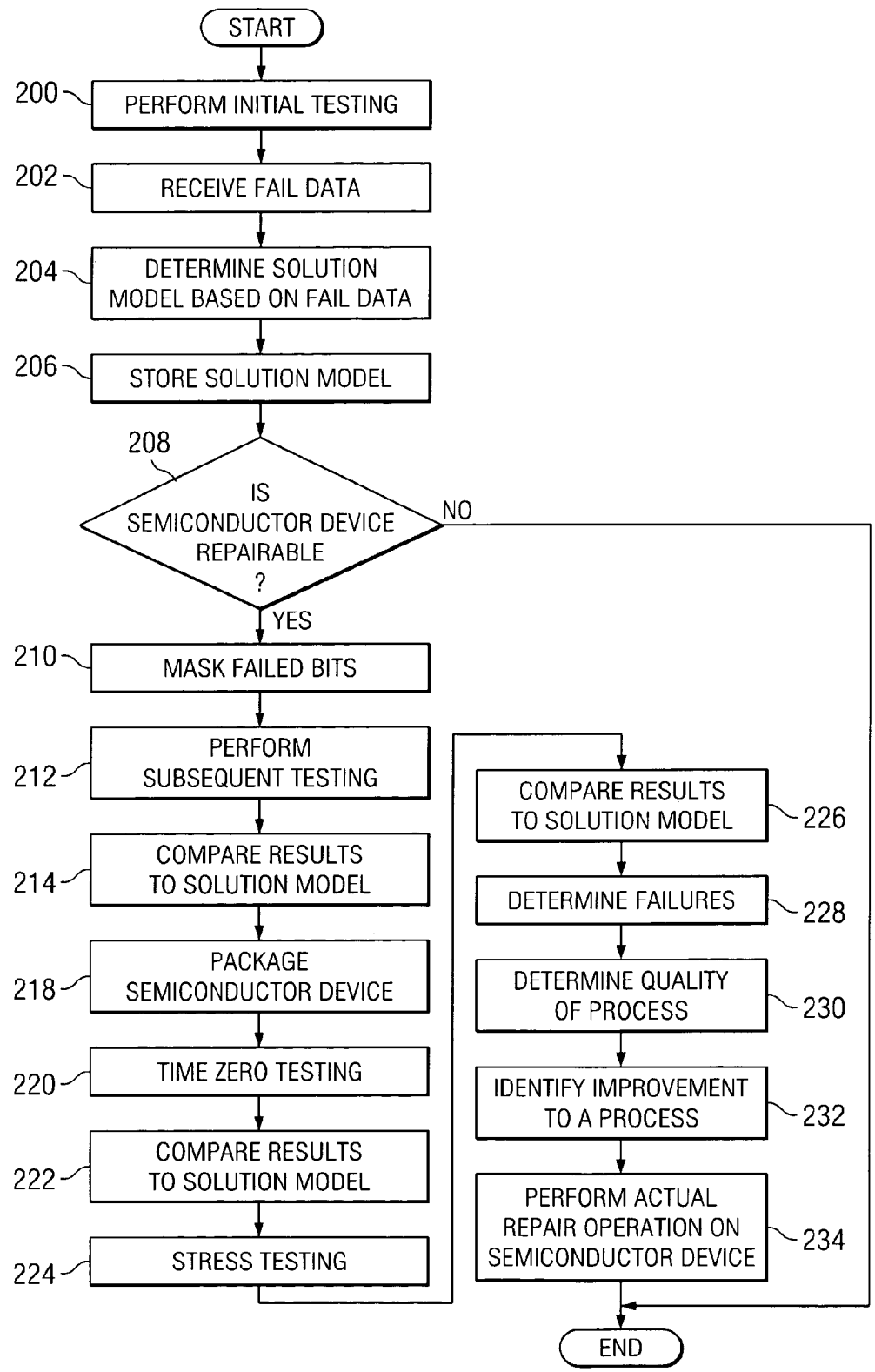
FIG. 2 is a flowchart illustrating a method for early qualification of semiconductor devices according to an embodiment of the present invention

Example embodiments of the present invention and their advantages are best understood by referring now to FIGS. 1 through 2 of the drawings, in which like numerals refer to like parts.

FIG. 1 is a block diagram illustrating a system 100 for early qualification of semiconductor devices, such as semiconductor device 102, according to one embodiment of the present invention. Any suitable semiconductor devices are contemplated by the present invention; however, in the illustrated embodiment, semiconductor device 102 is a memory chip, such as an SRAM.

Semiconductor devices, such as semiconductor device 102, are typically formed from a number of fabrication processes. Early qualification testing of semiconductor devices is important in assessing the fabrication processes for the semiconductor devices, especially for new immature fabrication processes. Early semiconductor devices fabricated with such immature fabrication processes may be rife with defects, resulting in few if any nominal or repairable die for early failure rate studies. These defects are typically uncovered during testing of semiconductor devices. For example, this testing may be accomplished by test equipment 104, which may be any suitable equipment or devices for testing semiconductor device 102.

In one embodiment, test equipment 104 is any suitable combination of hardware and/or software operable to perform any suitable number or types of tests on semiconductor device 102. For example, test equipment 104 may be operable to test semiconductor device 102 for opens, shorts, leakage, memory functionality, or other suitable defects. In addition, test equipment 104 may perform time zero testing, stress testing, or other suitable environmental, physical, or electrical tests on semiconductor device 102 after packaging.

Test equipment 104 may include a memory 106, which may include any suitable volatile or nonvolatile memory. Memory 106 may comprise random access memory, read-only memory, CD-ROM, removable memory devices, or any other suitable device that allows storage and/or retrieval of data. Memory 106 may be in any suitable physical location with respect to test equipment 104 and may be coupled to test equipment 104 in any suitable manner. In the illustrated embodiment, memory 106 stores comparison results 108 in solution model 110, which are described in further detail below.

Also illustrated in FIG. 1 as a part of system 100 is a user 112 manipulating a computer 114 that includes a processor 115, memory 116 and a database 118. User 112 may be any suitable testing personnel for a semiconductor manufacturer and a computer 114 may be any suitable computing device, such as a PC. Computer 114 is coupled to testing equipment 104 in any suitable manner in order to exchange information and/or data with test equipment 104.

Processor 115 comprises any suitable processing unit that executes logic. One of the functions of processor 115 is to retrieve a virtual repair tool 120 from memory 116 and execute the functions of virtual repair tool 120 based on input into computer 114 from test equipment 104. Processor 115 may also control the receiving, storing, and retrieving of information in memory 116, database 118, or any other suitable storage location. Other suitable functions of processor 115 are contemplated by the present invention. Memory 116 and database 118 may be integral with or separate from computer 114. Both memory 116 and database 118 may comprise files, stacks, databases, or other suitable organizations of volatile or non-volatile memory.

Each of the components of system 100 illustrated in FIG. 1 may be coupled to one another via any suitable communications network, such as a local area network, a wide area network, a virtual private network, or any other suitable network, public or private.

According to the teachings of one embodiment of the invention, system 100 includes virtual repair tool 120 that functions, in one embodiment, to allow the use of partially working semiconductor devices for early qualification of semiconductor devices. Thus, early learning on new immature fabrication processes for semiconductor devices may be realized. Some functionality of virtual repair tool 120 is described in detail below in conjunction with FIG. 2. Virtual repair tool 120 may be any suitable computer program or programs written in any suitable computer language that is operable to determine solution model 110 for semiconductor device 102 based on fail data 122 of semiconductor device 102 received from test equipment 104. This facilitates, among other things, semiconductor device 102 to be used for subsequent testing without having to scrap semiconductor device 102. In the illustrated embodiment, virtual repair tool 120 is logic encoded in memory 116. However, in alternative embodiments, virtual repair tool 120 is implemented through application specific integrated circuits, field programmable gate arrays, digital signal processors, or other suitable specific or general purpose processors.

As mentioned above, database 118 may store fail data 122 and solution model 110 related to semiconductor device 102 for future use. Fail data 122 may represent any suitable defects in, or failures of, semiconductor device 102 uncovered during testing. For example, fail data 122 may be indicative of particular bits of a memory chip that have failed or particular rows or columns of memory bits that have failed. Virtual repair tool 120 is operable to receive fail data 122 from database 118 and create solution model 110 for that particular semiconductor device 102.

Solution model 110 may be any suitable solution model that is representative of a repaired semiconductor device 102. Thus, in the example of failed bits of a memory chip, solution model 110 masks the failed bits of semiconductor device 102 so that semiconductor device may be considered a virtual "good" chip; i.e., one that has no defects or failures. The masking of the bits mimics an actual repair of semiconductor device 102 so that test equipment 104 assumes that the bits have not failed and subsequent testing may be formed on semiconductor device 102 in order to gather further information on the defects or failures of semiconductor device 102 under different testing conditions. Thus, improvements to processes of manufacturing semiconductor device 102 may be identified quicker than previous methods for qualifying semiconductor devices. In one embodiment, solution model 110 is both stored in database 118 in addition to being written to memory 106 of test equipment 104 so that test equipment 104 may perform subsequent testing on semiconductor device 102 even though a portion of semiconductor device 102 has failed as represented by fail data 122.

FIG. 2 is a flowchart illustrating an example method for early qualification of semiconductor devices, such as semiconductor device 102, according to an embodiment of the present invention. The flowchart outlined in FIG. 2 illustrates some of the functionality of virtual repair tool 120.

The method begins at step 200 where initial testing is performed on semiconductor device 102. As described above, this may include testing for opens, shorts, leakage, memory functionality, or other suitable defects. As a result of this initial testing, fail data 122 is received by computer 114 from test equipment 104 and stored in database 118. As described above, fail data 122 may include any suitable defect information on semiconductor device 102, such as particular bits of a memory chip that have failed. Based on fail data 122, a solution model 110 is determined for semiconductor device 102, as indicated by step 204. Solution model 110 is also stored in database 118 or other suitable storage location, as indicated by step 206. As indicated above, solution model 110 may include a repair solution for semiconductor device 102, for example, masking failed bits, so that semiconductor device 102 may continue to be used for testing purposes without having to scrap semiconductor device 102 and start over with a new one.

At decisional step 208 it is determined whether or not semiconductor device 102 is repairable. Depending on the defects present in semiconductor device 102 based on initial testing, semiconductor device 102 may not be repairable and used as a testing device. In that case, the example method outlined in FIG. 2 ends. However, if semiconductor device 102 is repairable, then the method proceeds to step 210 where the failed bits are masked so that subsequent testing may be performed on semiconductor device 102, as indicated in step 212. In lieu of masking failed bits, as indicated by step 210, any suitable information contained in solution model 110 may be realized. The subsequent testing performed on semiconductor device 102 may be any suitable testing, such as timing tests, voltage performance window tests, and Iddq tests. The results of the subsequent testing are then compared to solution model 110 at step 214 and stored in memory 106 as comparison results 108.

Semiconductor device 102 is then packaged at step 218 to form an integrated circuit or other suitable device. Times zero testing may then be performed, as indicated by step 220. This time zero testing may be any suitable testing to verify that semiconductor device 102 still operates after being packaged. For example, this testing may indicate whether or not the bond wires have been properly connected. The results of the time zero testing are then compared to solution model 110 at step 222 and stored in memory 106 as comparison results 108. Subsequently, stress testing may be performed, as indicated by step 224. Stress testing may include any suitable stress testing, such as subjecting the semiconductor device 102 to various temperature, voltage, environmental, vibrational, or other suitable conditions or combinations thereof. One example of stress testing is burn-in. The results of the stress testing are then compared to solution model 110 at step 226 and stored in memory 106 as comparison results 108.

After all testing has been performed on semiconductor device 102, the failures are determined at step 228. The failures are determined based on the comparisons indicated above in steps 214, 222, and 226 and stored in memory 106 as comparison results 108. Based on these failures, a quality of a process for manufacturing semiconductor device 102 is determined at step 230. The process is used to identify any improvements to the process, as indicated by step 232. Thus, early learning on immature fabrication processes is facilitated, which speeds the release of semiconductor device 102 and reduces costs.

As an additional step in the example method, an actual repair on semiconductor device 102 may be performed at step 234. This may include utilizing a redundant set of bits in place of failed bits that happened early in the testing process. Any suitable repair or trim operations are contemplated by the present invention and the teachings of the present invention allow these repair or trim operations to be delayed until after the testing is completed.

Thus, a virtual repair solution according to the teachings of the present invention allows the use of partially working devices for early qualification of semiconductor devices. Early learning on new immature fabrication processes may be realized and repair and/or trim operations may be delayed to later test operations. Therefore, only a minimal amount of samples for an evaluation may be required for early qualification, which saves time and money.

Although embodiments of the invention and their advantages are described in detail, a person skilled in the art could make various alterations, additions, and omissions without departing from the spirit and scope of the present invention, as defined by the appended claims.

What is claimed is:

1. A method for early qualification of semiconductor devices, comprising:
   placing a semiconductor device in a test equipment;
   performing initial testing on a semiconductor device;
   receiving fail data on the semiconductor device;
   determining a solution model for the semiconductor device based on the fail data using a virtual repair tool;
   storing the solution model;
   performing subsequent testing on the semiconductor device using the solution model from the virtual repair tool;
   comparing a result of the subsequent testing to the solution model to form a comparison result;
   storing the comparison result in a memory device;
   packaging the semiconductor device;
   stress testing the semiconductor device;
   comparing a result of the stress testing to the solution model;
   determining failures of the semiconductor device from the result of the stress testing;
   determining a quality of a process based on the failures; and
   identifying an improvement to the process for manufacturing the semiconductor device based on the quality.

2. The method of claim 1, further comprising:
   determining one or more failures of the semiconductor device from the result of the subsequent testing; and
   identifying an improvement to a process for manufacturing the semiconductor device based on the fail data or the determined one or more failures.

3. The method of claim 1, further comprising:
   time zero testing the semiconductor device before stress testing; and
   comparing a result of the time zero testing to the solution model.

4. The method of claim 1, wherein the fail data comprises failed bits and determining the solution model comprises masking the failed bits.

5. The method of claim 1, wherein the fail data comprises failed bits and determining the solution model comprises masking the failed bits and designating spare bits to use in place of the failed bits.

6. The method of claim 1, further comprising performing an actual repair operation on the semiconductor device after the subsequent testing.

7. The method of claim 1, wherein the semiconductor device is a memory chip.

8. Computer readable media encoded with a computer program for early qualification of semiconductor devices, operable to:
   receive fail data on a semiconductor device from initial testing;
   determine a virtual solution model for the semiconductor device based on the fail data;
   store the virtual solution model; and
   compare a result of subsequent testing performed on the semiconductor device to the virtual solution model to form a comparison result, wherein the subsequent testing is performed prior to an actual repair of the semiconductor device;
   storing the comparison result in a memory device;
   comrare a result of stress testing of the semiconductor device to the solution model;
   determine failures of the semiconductor device from the result of the stress testing;
   determine a quality of a process based on the failures; and
   identify an improvement to the process for manufacturing the semiconductor device based on the quality.

9. The logic of claim 8, further operable to:
   determine one or more failures of the semiconductor device from the result of the subsequent testing; and
   identify an improvement to a process for manufacturing the semiconductor device based on the fail data or the determined one or more failures.

10. The logic of claim 8, further operable to compare a result of time zero testing to the solution model.

11. The logic of claim 8, wherein the fail data comprises failed bits and the logic is further operable to mask the failed bits.

12. The logic of claim 8, wherein the fail data comprises failed bits and the logic is further operable to mask the failed bits and designate spare bits to use in place of the failed bits.

13. The logic of claim 8, wherein the semiconductor device is a memory chip.

14. A method for early qualification of semiconductor devices, comprising:
   at least partially fabricating a semiconductor device;
   placing the semiconductor device in a test equipment;
   performing initial testing on a semiconductor device;
   receiving fail data on the semiconductor device;
   determining a solution model for the semiconductor device based on the fail data using a virtual repair tool;
   storing the solution model;
   performing subsequent testing on the semiconductor device;
   comparing a result of the subsequent testing to the solution model to form a comparison result;
   storing the comparison result in a memory device;
   packaging the semiconductor device;
   time zero testing the semiconductor device;
   comparing a result of the time zero testing to the solution model;
   stress testing the semiconductor device;
   comparing a result of the stress testing to the solution model;
   determining failures of the semiconductor device from the result of at least one of the subsequent testing, time zero testing, and stress testing;
   determining a quality of a process based on the failures; and
   identifying an improvement to the process for manufacturing the semiconductor device based on the quality.

15. The method of claim 14, wherein the fail data comprises failed bits and determining the solution model comprises masking the failed bits.

16. The method of claim 14, wherein the fail data comprises failed bits and determining the solution model comprises masking the failed bits and designating spare bits to use in place of the failed bits.

17. The method of claim 14, further comprising performing an actual repair operation on the semiconductor device sometime after the subsequent testing.

18. The method of claim 14, wherein the semiconductor device is a memory chip.

* * * * *